United States Patent
Chou

(10) Patent No.: US 9,997,230 B1
(45) Date of Patent: Jun. 12, 2018

(54) REFERENCE VOLTAGE PRE-PROCESSING CIRCUIT AND REFERENCE VOLTAGE PRE-PROCESSING METHOD FOR A REFERENCE VOLTAGE BUFFER

(71) Applicant: Elite Semiconductor Memory Technology Inc., Hsinchu (TW)

(72) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days. days.

(21) Appl. No.: 15/628,203

(22) Filed: Jun. 20, 2017

(51) Int. Cl.
| H03K 17/00 | (2006.01) |
| H03K 19/003 | (2006.01) |
| H03K 17/16 | (2006.01) |
| H01H 47/00 | (2006.01) |
| H03K 17/06 | (2006.01) |
| H01L 27/12 | (2006.01) |
| G11C 11/4074 | (2006.01) |
| G05F 3/24 | (2006.01) |
| H03K 5/24 | (2006.01) |
| G05F 1/46 | (2006.01) |
| H03H 19/00 | (2006.01) |
| G11C 5/14 | (2006.01) |

(52) U.S. Cl.
CPC .......... *G11C 11/4074* (2013.01); *G05F 1/465* (2013.01); *G05F 3/24* (2013.01); *G11C 5/147* (2013.01); *H03H 19/004* (2013.01); *H03K 5/24* (2013.01)

(58) Field of Classification Search
CPC ...... H03K 17/00; H03K 19/003; H03K 17/16; H03K 17/06; H01H 47/00; H01L 27/12; G11C 11/4074; G11C 5/147; G05F 1/465; G05F 3/24

USPC ..... 327/108–112, 379, 389, 391; 326/22–27, 326/81–87
See application file for complete search history.

(56) References Cited

U.S. PATENT DOCUMENTS

| 4,810,969 | A  * | 3/1989 | Fulkerson | H03K 19/0013 326/102 |
| 6,262,919 | B1 * | 7/2001 | Chou | G11C 17/16 327/525 |
| 6,850,108 | B2 * | 2/2005 | Shin | H03K 19/00315 326/82 |
| 7,411,318 | B2 * | 8/2008 | Kimura | H03K 19/01728 307/113 |
| 7,696,807 | B2 * | 4/2010 | Takahashi | H03K 19/00315 326/82 |
| 2002/0163365 | A1 * | 11/2002 | Jung | H03K 19/00315 327/108 |
| 2014/0320177 | A1 * | 10/2014 | Tan | H03K 17/00 327/109 |

\* cited by examiner

*Primary Examiner* — Brandon S Cole
(74) *Attorney, Agent, or Firm* — Skaar Ulbrich Macari, P.A.

(57) ABSTRACT

Embodiments of the invention relate to a reference voltage pre-processing circuit and method for a reference voltage buffer. The embodiments include a filter to control/reduce the noise and/or interference attached to a reference voltage to be provided to a reference voltage buffer by passing the reference voltage via two transistor in series. Furthermore, the embodiments include an auxiliary voltage circuit which interfaces the filter and the reference voltage buffer to avoid that the reference voltage buffer get an invalid reference voltage.

8 Claims, 3 Drawing Sheets

REFERENCE VOLTAGE PRE-PROCESSING CIRCUIT AND REFERENCE VOLTAGE PRE-PROCESSING METHOD FOR A REFERENCE VOLTAGE BUFFER

FIELD

Some embodiments of the invention relate to a pre-processing circuit and a pre-processing method. More specifically, some embodiments of the invention relate to a reference voltage pre-processing circuit and a reference voltage pre-processing method for a reference voltage buffer.

BACKGROUND

A lot of circuits rely on a reference voltage to provide a reference voltage level for various applications. For example, an Analog-to-digital converter (ADC) or a Digital-to-analog converter (DAC) circuit may need a reference voltage to be a Least significant bit (LSB) level, and a regulator may need a reference voltage to be a reference output voltage level.

Generally, the reference voltage is generated by a reference voltage generator, and a reference voltage buffer circuit is commonly set between the reference voltage generator and the concerned circuits to ensure the ability of the reference voltage. However, the reference voltage provided by the reference voltage circuit may be affected by noise and/or interference such that sometimes the concerned circuits cannot obtain an enough clean reference voltage (e.g., a stable and accurate reference voltage) to perform the desired applications. In view of this, it is important to provide a solution to improve the problems in the art.

SUMMARY

To improve the aforesaid problems, one or more embodiments of the invention may be a reference voltage pre-processing circuit for a reference voltage buffer. The reference voltage pre-processing circuit may comprise a filter and an auxiliary voltage circuit. The filter may comprise a first transistor and a second transistor and the auxiliary voltage circuit is configured to interface the second transistor and the reference voltage buffer. The first transistor may comprise a gate electrode configured to connect to a ground, a first electrode, and a second electrode. The second transistor may comprise a gate electrode configured to connect to a voltage source, a first electrode connected to the second electrode of the first transistor, and a second electrode. The first transistor is a PMOS transistor, and the second transistor is an NMOS transistor. One of the first electrode of the first transistor and the second electrode of the second transistor may be configured to receive a first reference voltage and the other electrode may be configured to provide a second reference voltage originating from the first reference voltage to the reference voltage buffer. The auxiliary voltage circuit provides a third reference voltage to the reference voltage buffer if the second reference voltage is invalid and provides a fourth reference voltage to the reference voltage buffer if the second reference voltage is valid.

To improve the aforesaid problems, one or more embodiments of the invention may be a reference voltage pre-processing method for a reference voltage buffer. The reference voltage pre-processing method may comprise:

passing a first reference voltage to a second transistor via a first transistor;

providing a second reference voltage originating from the first reference voltage to the reference voltage buffer by the second transistor;

providing a third reference voltage to the reference voltage buffer by an auxiliary voltage circuit which interfaces the second transistor and the reference voltage buffer if the second reference voltage is invalid; and providing a fourth reference voltage to the reference voltage buffer by the auxiliary voltage circuit if the second reference voltage is valid.

In the reference voltage pre-processing method, one of the first transistor and the second transistor may be a PMOS transistor and the other transistor may be an NMOS transistor. The PMOS transistor may comprise a gate electrode configured to connect to a ground, a first electrode, and a second electrode, and the NMOS transistor may comprise a gate electrode configured to connect to a voltage source, a first electrode connected to the second electrode of the first transistor, and a second electrode. One of the first electrode of the PMOS transistor and the second electrode of the NMOS transistor may be configured to receive the first reference voltage and the other electrode may be configured to provide the second reference voltage to the reference voltage buffer.

The detailed technology and preferred embodiments implemented for the invention are described in the following paragraphs accompanying the appended drawings for people skilled in the art to well appreciate the features of the invention.

DETAILED DESCRIPTION

The example embodiments described below are not intended to limit the invention to any specific environment, embodiment, example, applications, structures, processes or steps described in these example embodiments. In the attached drawings, elements unrelated to the invention are omitted from depiction. Dimensions and dimensional relationships among individual elements in the attached drawings are only exemplary examples and are not intended to limit the invention. Unless stated particularly, same (or similar) element numerals may correspond to same (or similar) elements in the following description.

Figure 1:
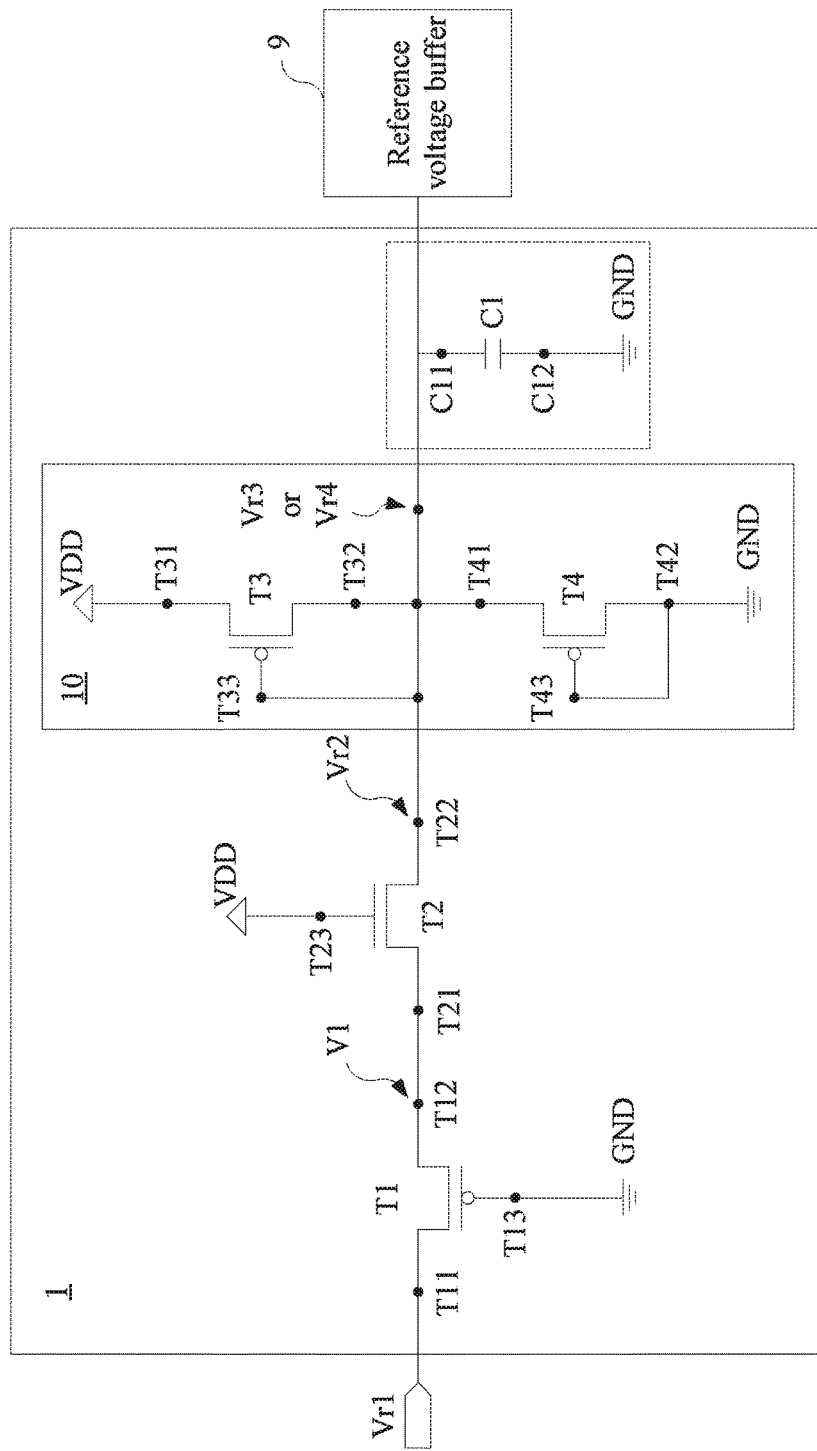
FIG. 1 illustrates a reference voltage pre-processing circuit for a reference voltage buffer according to one or more embodiments of the invention.

FIG. 1 illustrates a reference voltage pre-processing circuit for a reference voltage buffer according to one or more embodiments of the invention. However, the reference voltage pre-processing circuit illustrated in FIG. 1 is only provided as an exemplary example, but not to limit the present invention. Referring to FIG. 1, a reference voltage pre-processing circuit 1 for a reference voltage buffer 9 may comprise a filter and an auxiliary voltage circuit 10. The filter may comprises a first transistor T1 and a second transistor T2 and the auxiliary voltage circuit 10 is configured to interface the second transistor T2 and the reference voltage buffer 9.

The first transistor T1 is a PMOS transistor, and comprises a first electrode T11 (i.e., the source electrode) configured to receive a first reference voltage Vr1, a second electrode T12 (i.e., the drain electrode), and a gate electrode T13 configured to connect to a ground GND. The first reference voltage Vr1 may be generated and provided by anyone of various known reference voltage generators in the art. The first reference voltage Vr1 may be a DC voltage with or without noise and/or interference attached to the DC voltage.

The second transistor T2 is an NMOS transistor, and comprises a first electrode T21 (i.e., the drain electrode) connected to the second electrode T12 of the first transistor T1, a second electrode T22 (i.e., the source electrode) configured to provide a second reference voltage Vr2 originating from the first reference voltage Vr1 to the reference voltage buffer 9, and a gate electrode T23 configured to connect to a voltage source VDD. The reference voltage buffer 9 may be anyone of various known reference voltage buffers in the art, which is commonly modelled as a uni-gain circuit (e.g., a voltage follower) to buffer the second reference voltage Vr2 and ensure its ability.

The channel of the first transistor T1 can be turned on only if the absolute voltage difference between the gate electrode T13 and the first electrode T11 (i.e., the absolute voltage difference between the first reference voltage Vr1 and the ground GND) is substantially larger than a threshold voltage of the first transistor T1. The first reference voltage Vr1 can pass through the first transistor T1 (from the first electrode T11 to the second electrode T11) to be provided to the first electrode T21 of the second transistor T2 only if the channel of the first transistor T1 is turned on. Therefore, only the part of the first reference voltage Vr1 which is larger than a predetermined lower voltage level (i.e., the threshold voltage of the first transistor T1) can pass through the first transistor T1. In other words, the rest of the first reference voltage Vr1 which is smaller than the predetermined lower voltage level can be filtered out due to the layout and configuration of the first transistor T1. The part of the first reference voltage Vr1 passing through the first transistor T1 is labeled as V1 in FIG. 1, for example.

The channel of the second transistor T2 can be turned on only if the absolute voltage difference between the gate electrode T23 and the second electrode T22 (i.e., the absolute voltage difference between the voltage at the second electrode T22 and the voltage source VDD) is substantially larger than a threshold voltage of the second transistor T2. The threshold voltage of the second transistor T2 may be the same or not as the threshold voltage of the first transistor T1 depending on different needs. The voltage V1 can pass through the second transistor T2 (from the first electrode T21 to the second electrode T22) to be provided to the reference voltage buffer 9 only if the channel of the second transistor T2 is turned on. Therefore, only the part of the voltage V1 which is smaller than a predetermined upper voltage level (i.e., the voltage source VDD minus the threshold voltage of the second transistor T2) can pass through the second transistor T2. In other words, the rest of the voltage V1 which is larger than the predetermined upper voltage level can be filtered out due to the layout and configuration of the second transistor T2. The part of the voltage V1 passing through the second transistor T2 is labeled as Vr2 in FIG. 1, for example.

According to operations of the first transistor T1 and the second transistor T2, only the part of the first reference voltage Vr1 which ranges between the predetermined lower voltage level and the predetermined upper voltage level (i.e., the second reference voltage Vr2) can be provided to the reference voltage buffer 9. Under the circumstances, the part of noise and/or interference attached to the first reference voltage Vr1 which does not range between the predetermined lower voltage level and the predetermined upper voltage level can also be filtered out.

An expected value of the first reference voltage Vr1 may be determined according to various applications of the concerned circuits. For example, an expected value of the first reference voltage Vr1 may be ideally half of the voltage source VDD with a range from 0.49 times the voltage source VDD to 0.51 times the voltage source VDD, as defined in DDR3 specification issued by the Joint Electron Device Engineering Council (JEDEC).

In the case where the expected value of the first reference voltage Vr1 is half of the voltage source VDD, the auxiliary voltage circuit 10 may comprise a third transistor T3 and a fourth transistor T4 as shown in FIG. 1. The third transistor T3 is a PMOS transistor and may comprise a gate electrode T33 connected to the second electrode T22 of the second transistor T2, a first electrode T31 (i.e., the source electrode) configured to connect to the voltage source, and a second electrode T32 (i.e., the drain electrode) connected to the gate electrode T33. The fourth transistor T4 is a PMOS transistor which may be the same as the third transistor T3, and the fourth transistor T4 may comprise a gate electrode T43, a first electrode T41 (i.e., the source electrode) connected to the second electrode T32 of the third transistor T3, and a second electrode T42 (i.e., the drain electrode) connected to the gate electrode T43 and the ground GND.

Referring to FIG. 1, the second reference voltage Vr2 may become invalid (e.g., 0V) in a case where the first reference voltage Vr1 is smaller than the predetermined lower voltage level (i.e., the threshold voltage of the first transistor T1) or larger than the predetermined upper voltage level (i.e., the voltage source VDD minus the threshold voltage of the second transistor T2). Also, the second reference voltage Vr2 may be invalid before the reference voltage generator provides the first reference voltage Vr1. In those cases, the channels of the third transistor T3 and the fourth transistor T4 both are turned on, so the auxiliary voltage circuit 10 can, according to the voltage divider rule, provide a third reference voltage Vr3 (i.e., half of the voltage source VDD) in place of the second reference voltage Vr2 to the reference voltage buffer 9, to avoid providing an invalid voltage to the reference voltage buffer 9 and the subsequent concerned circuits.

The auxiliary voltage circuit 10 may provide a fourth reference voltage Vr4 in place of the second reference voltage Vr2 to the reference voltage buffer 9 even if the second reference voltage Vr2 is valid (e.g., larger than 0V). This is helpful especially in a case where the second reference voltage Vr2 does not approach half of the voltage source VDD enough. In such case, although the channels of the third transistor T3 and the fourth transistor T4 both are still turned on, the auxiliary voltage circuit 10 may provide the fourth reference voltage Vr4 by adding a voltage offset into the second reference voltage Vr2 to make the second reference voltage Vr2 towed towards half of the voltage source VDD, for example.

An exemplary example is provided herein for describing the reference voltage pre-processing circuit 1 in general, but the exemplary example is not a limitation to the present invention. In the exemplary example, it is pretended that the voltage source VDD is 1.8V, the threshold voltage of the first transistor T1 is 0.7V, and the threshold voltage of the second transistor T2 is 0.7V. In such example, only the part of the first reference voltage Vr1 which ranges from 0.7V (i.e., the threshold voltage of the first transistor T1) to 1.1V (i.e., the voltage source VDD minus the threshold voltage of the second transistor T2) can pass through the first transistor T1 and the second transistor T2. In other words, the other part of the first reference voltage Vr1 which is smaller than 0.7 or larger than 1.1 can be filtered out.

Furthermore, in such example, if the second reference voltage Vr2 is invalid (e.g., 0V), the auxiliary voltage circuit 10 may provide a third reference voltage Vr3 with 0.9V (i.e., half of the voltage source VDD) to the reference voltage buffer 9. If the second reference voltage Vr2 is 1V (i.e., a valid voltage), the auxiliary voltage circuit 10 may provide a fourth reference voltage Vr4 with 0.95V to the reference voltage buffer 9 to make the second reference voltage Vr2 towed towards 0.9V (i.e., half of the voltage source VDD).

In some embodiments, in addition to the first transistor T1, the second transistor T2 and the auxiliary voltage circuit 10, the reference voltage pre-processing circuit 1 may further comprises a capacitor C1 which is an optional element in the invention as shown in FIG. 1. The capacitor C1 is configured to stabilize the voltage to be provided to the reference voltage buffer 9 (i.e., the third reference voltage Vr3 or the fourth reference voltage Vr4 in FIG. 1). For example, in order to stabilize the voltage to be provided to the reference voltage buffer 9, the capacitor C1 may comprise a first electrode C11 connected to the second electrode T22 of the second transistor T2, and a second electrode C12 configured to connect to the ground GND.

Figure 2:
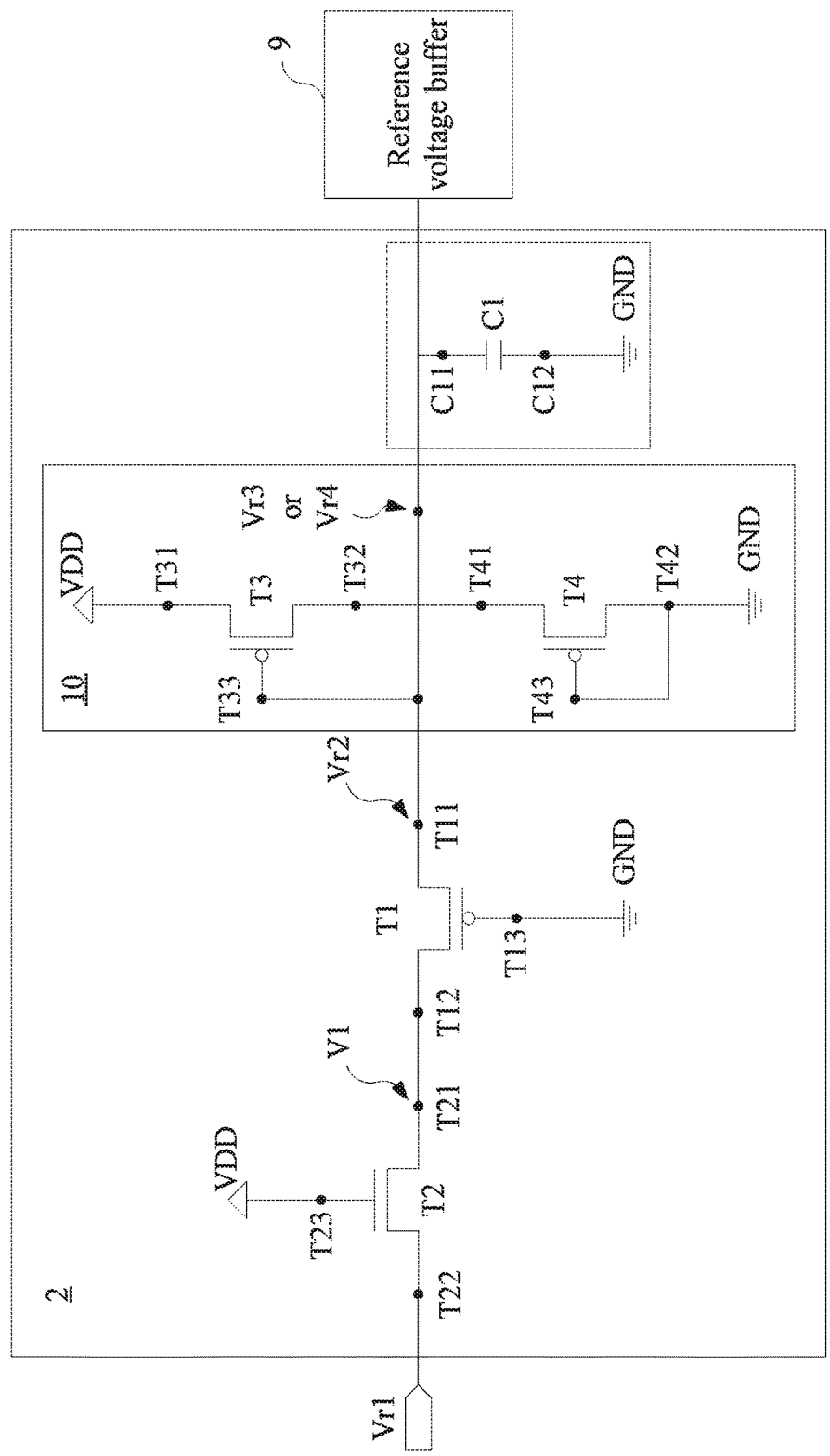
FIG. 2 illustrates an alternative to the reference voltage pre-processing circuit of FIG. 1 according to one or more embodiments of the invention.

FIG. 2 illustrates an alternative to the reference voltage pre-processing circuit of FIG. 1 according to one or more embodiments of the invention. However, the reference voltage pre-processing circuit illustrated in FIG. 2 is only provided as an exemplary example, but not to limit the present invention. Referring to FIG. 2, a reference voltage pre-processing circuit 2 for a reference voltage buffer 9 may comprise a filter and an auxiliary voltage circuit 10. The filter may comprises a first transistor T1 and a second transistor T2 and the auxiliary voltage circuit 10 is configured to interface the first transistor T1 and the reference voltage buffer 9.

The difference between the reference voltage pre-processing circuit 1 and the reference voltage pre-processing circuit 2 is that the layouts of the first transistor T1 and second transistor T2 are exchanged. Specifically, in the reference voltage pre-processing circuit 2, the second transistor T2 is an NMOS transistor, and comprises a second electrode T22 (i.e., the drain electrode) configured to receive a first reference voltage Vr1, a first electrode T21 (i.e., the source electrode), and a gate electrode T23 configured to connect to a voltage source VDD. Also, the first transistor T1 is a PMOS transistor, and comprises a second electrode T12 (i.e., the source electrode) connected to the first electrode T21 of the second transistor T2, a first electrode T11 (i.e., the drain electrode) configured to provide a second reference voltage Vr2 originating from the first reference voltage Vr1 to the reference voltage buffer 9, and a gate electrode T13 configured to connect to a ground GND.

According to the layout and configuration of the second transistor T2 of the reference voltage pre-processing circuit 2, only the part of the first reference voltage Vr1 which is smaller than a predetermined upper voltage level (i.e., the voltage source VDD minus the threshold voltage of the second transistor T2) can pass through the second transistor T2. In other words, the rest of the first reference voltage Vr1 which is larger than the predetermined upper voltage level can be filtered out due to the layout and configuration of the second transistor T2. The part of the first reference voltage Vr1 passing through the second transistor T2 is labeled as V1 in FIG. 2, for example.

According to the layout and configuration of the first transistor T1 of the reference voltage pre-processing circuit 2, only the part of the voltage V1 which is larger than a predetermined lower voltage level (i.e., the threshold voltage of the first transistor T1) can pass through the first transistor T1. In other words, the rest of the voltage V1 which is smaller than the predetermined lower voltage level can be filtered out due to the layout and configuration of the first transistor T1. The part of the voltage V1 passing through the first transistor T1 is labeled as Vr2 in FIG. 2, for example.

Therefore, as same as the reference voltage pre-processing circuit 1, the reference voltage pre-processing circuit 2 provides that only the part of the first reference voltage Vr1 which ranges between the predetermined lower voltage level and the predetermined upper voltage level (i.e., the second reference voltage Vr2) can be provided to the reference voltage buffer 9. Under the circumstances, the part of noise and/or interference attached to the first reference voltage Vr1 which does not range between the predetermined lower voltage level and the predetermined upper voltage level can also be filtered out. As same as the reference voltage pre-processing circuit 1, the auxiliary voltage circuit 10 of the reference voltage pre-processing circuit 2 may provide a third reference voltage Vr3 (i.e., half of the voltage source VDD) in place of the second reference voltage Vr2 to the reference voltage buffer 9 if the second reference voltage Vr2 is invalid (e.g., 0V) and provide a fourth reference voltage Vr4 in place of the second reference voltage Vr2 to the reference voltage buffer 9 if the second reference voltage Vr2 is valid (e.g., larger than 0V). Since the auxiliary voltage circuit 10 of the reference voltage pre-processing circuit 2 does the same as that of the reference voltage pre-processing circuit 1 does, the relevant details will not be further described herein.

As same as the reference voltage pre-processing circuit 1, in addition to the second transistor T2, the first transistor T1 and the auxiliary voltage circuit 10, the reference voltage pre-processing circuit 2 may further comprises a capacitor C1 which is an optional element in the invention as shown in FIG. 2. The capacitor C1 is configured to stabilize the voltage to be provided to the reference voltage buffer 9 (i.e., the third reference voltage Vr3 or the fourth reference voltage Vr4 in FIG. 2). For example, in order to stabilize the voltage to be provided to the reference voltage buffer 9, the capacitor C1 may comprise a first electrode C11 connected to the first electrode T11 of the first transistor T1, and a second electrode C12 configured to connect to the ground GND.

Figure 3:
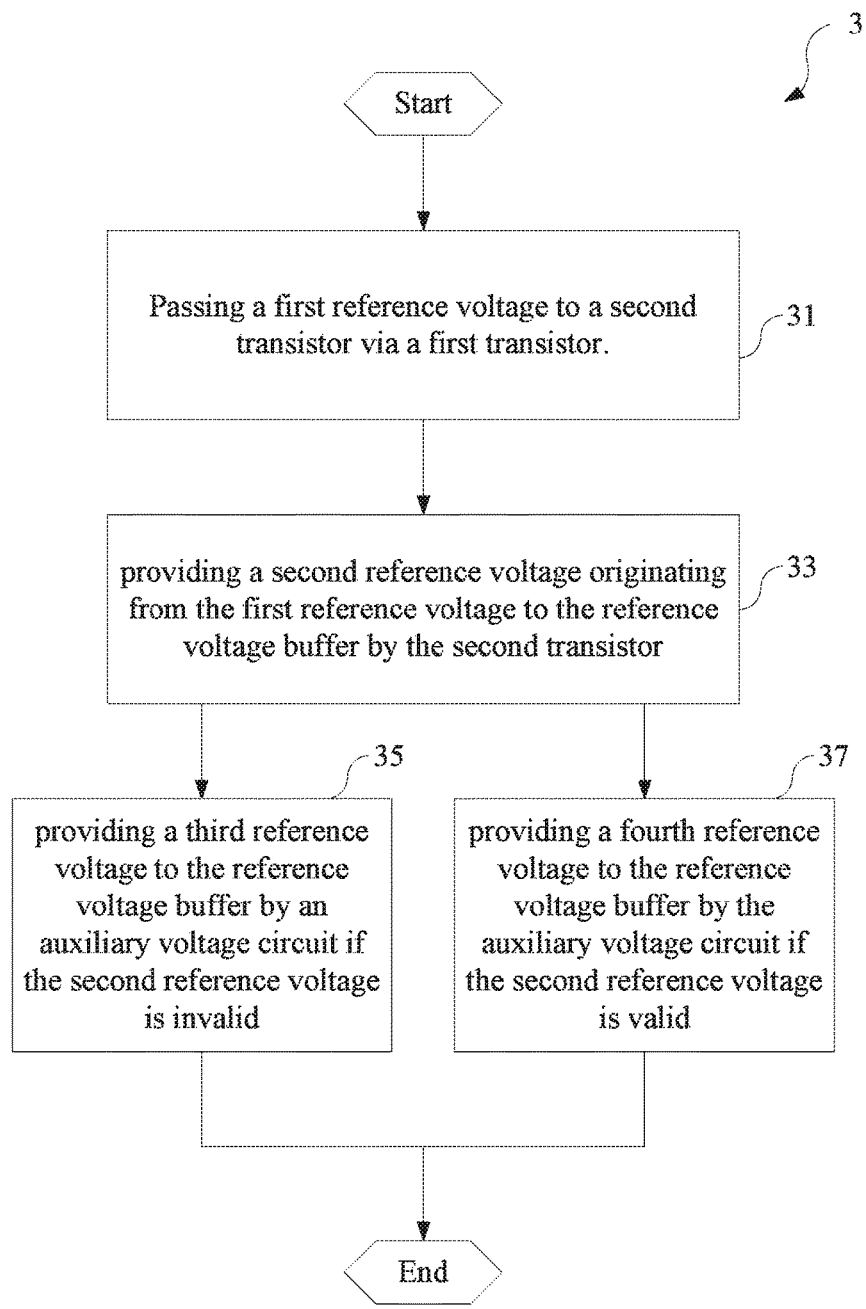
FIG. 3 illustrates a reference voltage pre-processing method for a reference voltage buffer according to one or more embodiments of the invention.

FIG. 3 illustrates a reference voltage pre-processing method for a reference voltage buffer according to one or more embodiments of the invention. However, the reference voltage pre-processing method illustrated in FIG. 3 is only provided as an exemplary example, but not to limit the invention. Referring to FIG. 3, a reference voltage pre-processing method 3 for a reference voltage buffer may comprise: passing a first reference voltage to a second transistor via a first transistor (labelled as step 31); providing a second reference voltage originating from the first reference voltage to the reference voltage buffer by the second transistor (labelled as step 33); providing a third reference voltage to the reference voltage buffer by an auxiliary voltage circuit which interfaces the second transistor and the reference voltage buffer if the second reference voltage is invalid (labelled as step 35); and providing a fourth reference voltage to the reference voltage buffer by the auxiliary voltage circuit if the second reference voltage is valid (labelled as step 37). The order of the steps shown in FIG. 3 is not intended to limit the invention. The order of the steps can be adjusted without departing from the spirit of the invention.

In the reference voltage pre-processing method 3, one of the first transistor and the second transistor is a PMOS transistor and the other transistor is an NMOS transistor. The PMOS transistor comprises a gate electrode configured to connect to a ground, a first electrode, and a second electrode, and the NMOS transistor comprises a gate electrode configured to connect to a voltage source, a first electrode connected to the second electrode of the first transistor, and a second electrode. In addition, one of the first electrode of the PMOS transistor and the second electrode of the NMOS transistor is configured to receive the first reference voltage and the other electrode is configured to provide the second reference voltage to the reference voltage buffer.

In some embodiments, the reference voltage pre-processing method 3 may be implemented in a case where the first transistor is the PMOS transistor and the second transistor is the NMOS transistor. In the case, the first electrode of the PMOS transistor is configured to receive the first reference voltage and the second electrode of the NMOS transistor is configured to provide the second reference voltage to the reference voltage buffer.

In the case, the auxiliary voltage circuit may comprise a third transistor and a fourth transistor. The third transistor is a PMOS transistor and comprises a gate electrode connected to the second electrode of the second transistor, a first electrode configured to connect to the voltage source, and a second electrode connected to the gate electrode. The fourth transistor is a PMOS transistor and comprises a gate electrode, a first electrode connected to the second electrode of the third transistor, and a second electrode connected to the gate electrode and the ground.

In addition, the reference voltage pre-processing method 3 may further comprise: stabilizing the third reference voltage or the fourth reference voltage by a capacitor which comprises a first electrode connected to the second electrode of the second transistor, and a second electrode configured to connect to the ground.

In some embodiments, the reference voltage pre-processing method 3 may be applied to the reference voltage pre-processing circuit 1 to accomplish all of the operations of the reference voltage pre-processing circuit 1. Since the corresponding steps for accomplishing the operations by the reference voltage pre-processing method 3 may be directly appreciated by people skilled in the art based on the aforesaid description of the reference voltage pre-processing circuit 1, the relevant details thereof will not be further described herein.

In the embodiments of the invention, the part of the first reference voltage which is smaller than a predetermined lower voltage level can be filtered out due to the layout and configuration of the PMOS transistor. In addition, the part of the first reference voltage which is larger than a predetermined upper voltage level can be filtered out due to the layout and configuration of the NMOS transistor. Therefore, only the part of the first reference voltage which ranges between the predetermined lower voltage level and the predetermined upper voltage level (i.e., the second reference voltage as mentioned above) can be outputted to the reference voltage buffer. At the same time, the part of noise and/or interference attached to the first reference voltage which does not range between the predetermined lower voltage level and the predetermined upper voltage level can also be filtered out. By properly determining the lower voltage level and the upper voltage level, the noise and/or interference attached to the first reference voltage can be controlled/reduced effectively to ensure providing a more clean reference voltage to the reference voltage buffer.

The second reference voltage may become invalid (e.g., 0V) in a case where the first reference voltage is smaller than the predetermined lower voltage level or larger than the predetermined upper voltage level. Also, the second reference voltage may be invalid before the reference voltage generator provides the first reference voltage. In those cases, the auxiliary voltage circuit can provide a third reference voltage in place of the second reference voltage to the reference voltage buffer, to avoid providing an invalid voltage to the reference voltage buffer and the subsequent concerned circuits. For example, auxiliary voltage circuit may provide the third reference voltage according to a predetermined voltage (e.g., half of the voltage source) which is an expected value of the second reference voltage.

The auxiliary voltage circuit may provide a fourth reference voltage in place of the second reference voltage to the reference voltage buffer even if the second reference voltage is valid. This is helpful especially in a case where the second reference voltage does not approach the predetermined voltage (e.g., half of the voltage source) enough. In such case, the auxiliary voltage circuit may provide the fourth reference voltage by adding a voltage offset into the second reference voltage, for example.

Consequently, the proposed reference voltage pre-processing circuit and reference voltage pre-processing method indeed provide a good solution to improve the aforesaid problems in the art.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A reference voltage pre-processing circuit for a reference voltage buffer, comprising:
   a first transistor, comprising a gate electrode configured to connect to a ground, a first electrode, and a second electrode;
   a second transistor, comprising a gate electrode configured to connect to a voltage source, a first electrode connected to the second electrode of the first transistor, and a second electrode; and
   an auxiliary voltage circuit, configured to interface the second transistor and the reference voltage buffer;
   wherein the first transistor is a PMOS transistor, the second transistor is an NMOS transistor, one of the first electrode of the first transistor and the second electrode of the second transistor is configured to receive a first reference voltage and the other electrode is configured to provide a second reference voltage originating from the first reference voltage to the reference voltage buffer; and
   wherein the auxiliary voltage circuit provides a third reference voltage to the reference voltage buffer if the second reference voltage is invalid and provides a fourth reference voltage to the reference voltage buffer if the second reference voltage is valid.

2. The reference voltage pre-processing circuit of claim 1, wherein the first electrode of the first transistor is configured to receive the first reference voltage and the second electrode of the second transistor is configured to provide the second reference voltage to the reference voltage buffer.

3. The reference voltage pre-processing circuit of claim 2, wherein the auxiliary voltage circuit comprises:
   a third transistor, comprising a gate electrode connected to the second electrode of the second transistor, a first electrode configured to connect to the voltage source, and a second electrode connected to the gate electrode; and
   a fourth transistor, comprising a gate electrode, a first electrode connected to the second electrode of the third transistor, and a second electrode connected to the gate electrode and the ground; and
   wherein the third transistor is a PMOS transistor and the fourth transistor is a PMOS transistor.

4. The reference voltage pre-processing circuit of claim 3, further comprising:
   a capacitor, comprising a first electrode connected to the second electrode of the second transistor, and a second electrode configured to connect to the ground.

5. A reference voltage pre-processing method for a reference voltage buffer, comprising:
   passing a first reference voltage to a second transistor via a first transistor;
   providing a second reference voltage originating from the first reference voltage to the reference voltage buffer by the second transistor;
   providing a third reference voltage to the reference voltage buffer by an auxiliary voltage circuit which interfaces the second transistor and the reference voltage buffer if the second reference voltage is invalid; and
   providing a fourth reference voltage to the reference voltage buffer by the auxiliary voltage circuit if the second reference voltage is valid;
   wherein one of the first transistor and the second transistor is a PMOS transistor and the other transistor is an NMOS transistor, the PMOS transistor comprises a gate electrode configured to connect to a ground, a first electrode, and a second electrode, and the NMOS transistor comprises a gate electrode configured to connect to a voltage source, a first electrode connected to the second electrode of the first transistor, and a second electrode; and
   wherein one of the first electrode of the PMOS transistor and the second electrode of the NMOS transistor is configured to receive the first reference voltage and the other electrode is configured to provide the second reference voltage to the reference voltage buffer.

6. The reference voltage pre-processing method of claim 5, wherein the first transistor is the PMOS transistor and the second transistor is the NMOS transistor, and wherein the first electrode of the PMOS transistor is configured to receive the first reference voltage and the second electrode of the NMOS transistor is configured to provide the second reference voltage to the reference voltage buffer.

7. The reference voltage pre-processing method of claim 6, wherein the auxiliary voltage circuit comprises a third transistor and a fourth transistor, the third transistor is a PMOS transistor and comprises a gate electrode connected to the second electrode of the second transistor, a first electrode configured to connect to the voltage source, and a second electrode connected to the gate electrode, the fourth transistor is a PMOS transistor and comprises a gate electrode, a first electrode connected to the second electrode of the third transistor, and a second electrode connected to the gate electrode and the ground.

8. The reference voltage pre-processing method of claim 7, further comprising:
   stabilizing the third reference voltage or the fourth reference voltage by a capacitor which comprises a first electrode connected to the second electrode of the second transistor, and a second electrode configured to connect to the ground.

* * * * *